United States Patent [19]

Lee et al.

[11] Patent Number: 5,759,335
[45] Date of Patent: Jun. 2, 1998

[54] PHOTORESIST REMOVING APPARATUS

[75] Inventors: Gyu-myeung Lee, Anyang; Jong-su Kim, Suwon, both of Rep. of Korea

[73] Assignee: Samsung Electronics Co., Ltd., Suwon, Rep. of Korea

[21] Appl. No.: 773,341

[22] Filed: Dec. 26, 1996

[51] Int. Cl.⁶ .................................................. H01L 21/00
[52] U.S. Cl. .................................................. 156/345; 216/92
[58] Field of Search ........................ 156/345 L, 345 LS; 216/92; 134/32, 34, 165, 198; 438/725, 748

[56] References Cited

U.S. PATENT DOCUMENTS 5,185,056  2/1993  Fuentes et al. ................. 156/345 X
5,268,067  12/1993  Dostalik et al. ................. 438/725 X

*Primary Examiner*—William Powell
*Attorney, Agent, or Firm*—Jones & Volentine, L.L.P.

[57] ABSTRACT

An apparatus for removing a photoresist from the edge of a semiconductor wafer includes a nozzle for finely spraying a liquid for removing a photoresist. The horizontal position of the nozzle is controlled by a horizontal fixture having a screw groove formed therein. A guide rail has a channel into which the horizontal fixture is slidably inserted. A scale marked on a peripheral surface of the guide rail verifies the position of a reference mark on the horizontal fixture. A fine adjustment screw is inserted into the screw groove of the horizontal fixture to a variable depth for adjusting the horizontal position of the horizontal fixture. A shaft is connected to the guide rail, with the shaft having a top portion functioning as a piston, for adjusting the vertical position of the nozzle by fixing the guide rail to the shaft and moving the resulting combination up and down. The top portion of the shaft is movable within a cylinder. The fine horizontal and vertical adjustment of the nozzle allows adequate removal of the photoresist from the edge of the wafer, increasing the yield of the semiconductor devices.

3 Claims, 2 Drawing Sheets

PHOTORESIST REMOVING APPARATUS

BACKGROUND OF THE INVENTION

Field of the Invention

The present invention relates to a photoresist removing apparatus, and more particularly, to an apparatus for removing a photoresist formed on the edge of a semiconductor wafer.

Description of the Related Art

During a photolithography process for a semiconductor device, if the photoresist remains on the edge portion of a wafer, a photoresist powder may be generated by friction between the wafer and a wafer cassette. The photoresist powder collects on the bottom surface of the next wafer to be sequentially transferred to a wafer chuck of the exposing equipment, thus contaminating the wafer chuck. If the photoresist powder contaminates the wafer chuck, the wafer to be exposed on the chuck is not level, causing a defocusing during the exposing process. In order to solve this problem, the photoresist on the edge portion of the wafer is removed after a photoresist coating step.

FIG. 1 is a sectional view of a conventional photoresist removing apparatus. As shown in FIG. 1, the conventional photoresist removing apparatus includes a nozzle 1 through which a liquid, i.e., a thinner, is supplied for partially removing a photoresist 9 coated on a semiconductor wafer 8. A needle 2 is connected to one end of the nozzle 1 for finely spraying the liquid. A horizontal fixture 3 fixes the nozzle 1. A shaft 5 has a top portion which functions as a piston for moving the horizontal fixture 3 in a vertical direction. Fixing bolts 4 adjust the horizontal position of the horizontal fixture 3. A cylinder 6 is provided with a space 7 in which the piston portion of the shaft 5 is movably inserted. The fixing bolts 4 are fixed to a panel 10.

The width of the portion of the photoresist to be removed from the semiconductor wafer 8 is determined by the horizontal and vertical position of the needle 2. The removal width is adjusted by unfastening the fixing bolts 4 and horizontally moving them to the left or right and then fixing them on the fixing panel 10. The fixing bolts 4 are moved left and right by sight only.

Also, during removal of the photoresist, the piston portion of the shaft 5 moves up and down in the cylinder 6 to adjust the height of the needle 2.

However, if the position of the needle 2 is not adjusted exactly, the photoresist 9 at the edge of the semiconductor wafer 8 may not be properly removed.

SUMMARY OF THE INVENTION

Therefore, it is an object of the present invention to provide an apparatus for adequately removing a photoresist from the edge of a semiconductor wafer by exact adjustment of the position of a needle.

To accomplish these and other objects, there is provided an apparatus for removing a photoresist from a semiconductor wafer edge comprising: a nozzle for finely spraying a liquid for removing a photoresist; a movable horizontal fixture for horizontally positioning the nozzle, the horizontal fixture having a screw groove formed therein, the screw groove being formed along an axis coexisting with an axis of movement of the horizontal fixture, and a reference mark formed on the horizontal fixture; a guide rail having a channel formed therein, into which the horizontal fixture is slidably inserted, and a scale marked on a peripheral surface of the guide rail for verifying an exact position of the reference mark; a fine adjustment screw inserted into the screw groove of the horizontal fixture to a variable depth for adjusting the horizontal position of the horizontal fixture; a shaft, having a top portion functioning as a piston, for adjusting a vertical position of the nozzle, the guide rail being fixed to the shaft for moving the nozzle up and down; and a cylinder into which the top portion of the shaft is movably inserted.

In an embodiment of the present invention, it is preferred that the fine adjustment screw has a screw thread having a pitch of about 0.5-2 mm, preferably 1 mm.

According to the present invention, the fine adjustment screw is inserted into a screw groove within the horizontal fixture. The screw is then rotated, thereby precisely adjusting the position of the needle. Also, since a reference mark formed on the horizontal fixture 3 is adjusted to a scale on the guide rail 19, the horizontal position of the needle can be precisely adjusted.

BRIEF DESCRIPTION OG THE DRAWINGS

The above objects and advantages of the present invention will become more apparent by describing in detail a preferred embodiment thereof with reference to the attached drawings in which.

DETAILED DESCRIPTION OF THE INVENTION

Figure 2A:
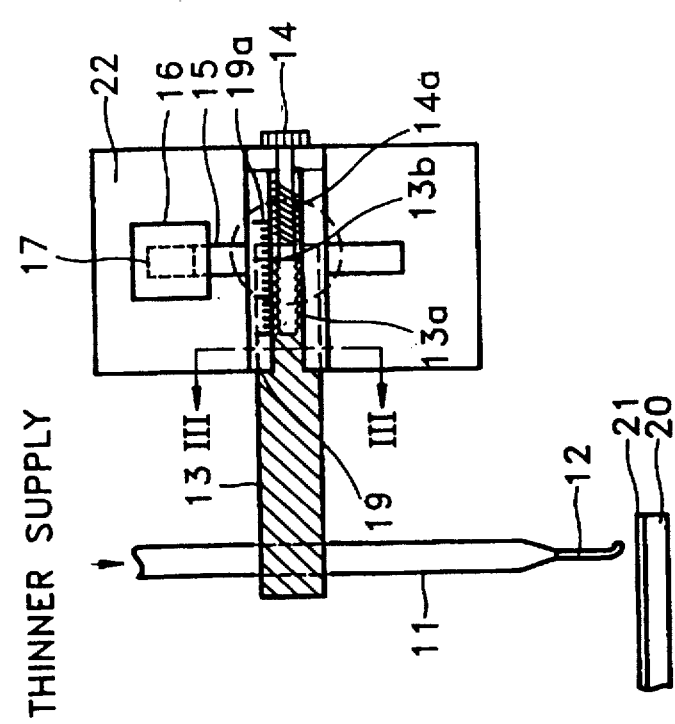
FIG. 2 is a schematic view of a photoresist removing apparatus according to the present invention.
Figure 2B:
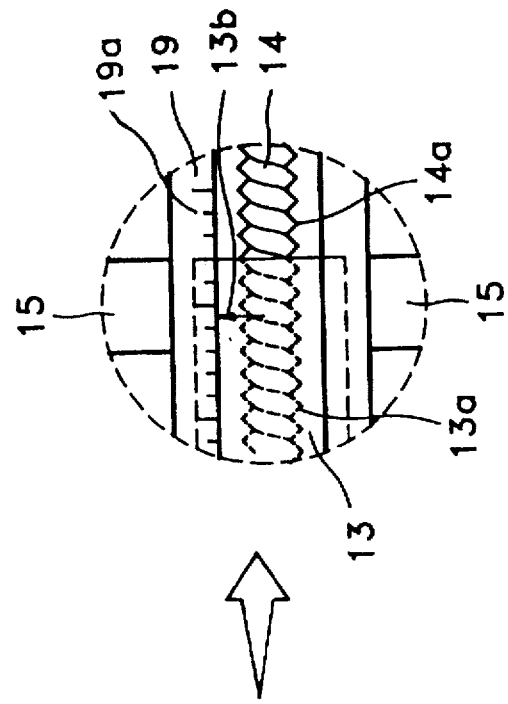

As shown in FIG. 2, the photoresist removing apparatus according to the present invention includes a nozzle 11 through which a liquid, i.e., thinner, is supplied for partially removing a photoresist 21 coated on a semiconductor wafer 20. A needle 12 is connected to one end of the nozzle 11 for finely spraying the liquid. A horizontal fixture 13 fixes the nozzle 11. A screw groove 13a is horizontally formed in the horizontal fixture 13 to a predetermined depth, along the coexisting axis of movement of the horizontal fixture. A reference mark 13b is formed on the horizontal fixture 13.

A fine adjustment screw 14 is provided for precisely moving the horizontal fixture 13 in a horizontal direction, with a screw thread 14a formed around the shaft of the fine adjustment screw 14. A guide rail 19 has a horizontal channel formed therein so that the horizontal fixture 13 is slidably moveable within the channel. A scale 19a is marked on the peripheral surface of the guide rail 19 for verifying the exact position of the reference mark 13b.

A shaft 15, the top portion of which functions as a piston, is connected to the guide rail 19 for adjusting the vertical distance between the needle 12 and the photoresist 21. Cylinder 16 is provided with a space 17 into which the piston portion of the shaft 15 is inserted. The guide rail 19 is fixed on a panel 22.

The horizontal position of the needle 12 is adjusted by rotating the fine adjustment screw 14. Rotation of the fine adjustment screw 14 changes the insertion depth of the fine adjustment screw 14 inserted into the horizontal fixture 13 via the screw groove 13a. The adjustment precision is influenced by the pitch of the screw thread 14a formed around the fine adjustment screw 14. In this regard, the fine adjustment screw 14 is provided with a screw thread 14a having a pitch of about 0.5-2 mm, preferably 1 mm.

Figure 1:
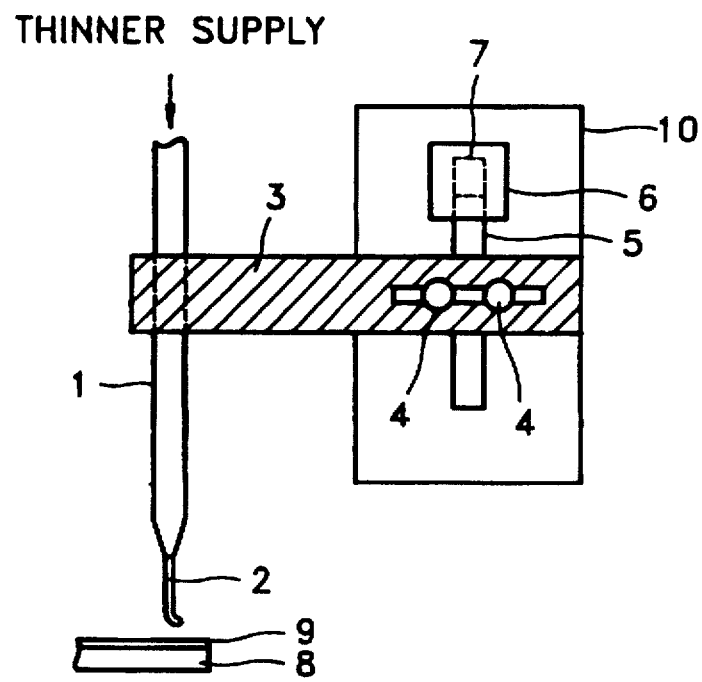
FIG. 1 is a schematic view of a conventional photoresist removing apparatus.
Figure 3:
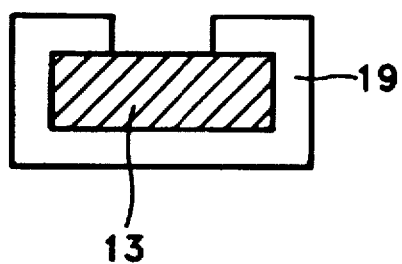
FIG. 3 is a sectional view taken along the line III—III of FIG. 2.

FIG. 3 is a sectional view taken along the line III13 III of FIG. 2 showing the guide rail 19 with a channel formed therein so that the horizontal fixture 13 is slidably moveable with the guide rail 19.

In the photoresist removing apparatus according to the present invention, the needle 12 is precisely adjusted in a horizontal direction by rotating the fine adjustment screw 14 inserted into the screw groove 13a in the horizontal fixture 13. Also, since the reference mark 13b formed on the horizontal fixture 13 is adjusted with reference to a scale 19a on the guide rail 19, the horizontal position of the needle 12 can be precisely adjusted. Therefore, inadequate removal of the photoresist 21 from the edge of the semiconductor wafer 20 can be prevented.

Although a preferred embodiment of the present invention have been described in detail hereinabove, it should be clearly understood that many variations and/or modifications of the basic inventive concepts herein taught, which may appear to those skilled in the art, will still fall within the spirit and scope of the present invention as defined in the appended claims and their equivalents.

What is claimed is:

1. An apparatus for removing a photoresist from the edge of a semiconductor wafer comprising:

a nozzle for finely spraying a liquid for removing a photoresist;

a movable horizontal fixture for horizontally positioning said nozzle, said horizontal fixture having a screw groove formed therein, said screw groove being formed along an axis coexisting with an axis of movement of the horizontal fixture, and a reference mark formed on said horizontal fixture;

a guide rail having a channel formed therein, into which said horizontal fixture is slidably inserted, and a scale marked on a peripheral surface of said guide rail for verifying an exact position of said reference mark;

a fine adjustment screw inserted into the screw groove of said horizontal fixture to a variable depth for adjusting the horizontal position of said horizontal fixture;

a shaft, having a top portion functioning as a piston, for adjusting a vertical position of said nozzle, said guide rail being fixed to said shaft for moving said nozzle up and down; and a cylinder into which the top portion of said shaft is movably inserted.

2. An apparatus for removing a photoresist from the edge of a semiconductor wafer as claimed in claim 1, wherein said fine adjustment screw has a screw thread having a pitch of about 0.5–2 mm.

3. An apparatus for removing a photoresist from the edge of a semiconductor wafer as claimed in claim 1, wherein said fine adjustment screw has a screw thread having a pitch of 1 mm.

* * * * *